US008916441B2

(12) United States Patent
Rashed et al.

(10) Patent No.: US 8,916,441 B2
(45) Date of Patent: Dec. 23, 2014

(54) FINFET DEVICE AND METHODS OF FABRICATION

(71) Applicant: GLOBALFOUNDRIES Inc., Grand Cayman (KY)

(72) Inventors: Mahbub Rashed, Cupertino, CA (US); Juhan Kim, Santa Clara, CA (US); Yunfei Deng, Sunnyvale, CA (US); Jongwook Kye, Pleasanton, CA (US); Suresh Venkatesan, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1 day.

(21) Appl. No.: 13/893,684

(22) Filed: May 14, 2013

(65) Prior Publication Data

US 2014/0339610 A1    Nov. 20, 2014

(51) Int. Cl.
*H01L 21/8234*    (2006.01)
*H01L 21/8244*    (2006.01)
*H01L 29/78*    (2006.01)
*H01L 29/66*    (2006.01)

(52) U.S. Cl.
CPC ........ *H01L 29/785* (2013.01); *H01L 29/66795* (2013.01)
USPC ............... 438/283; 257/401; 257/E21.421

(58) Field of Classification Search
None
See application file for complete search history.

(56) References Cited

U.S. PATENT DOCUMENTS

| | | | |
|---|---|---|---|
| 6,938,226 B2 | 8/2005 | Nguyen et al. | |
| 7,532,501 B2 | 5/2009 | Joshi et al. | |
| 2010/0078725 A1* | 4/2010 | Hou et al. | 257/368 |
| 2013/0001749 A1 | 1/2013 | Arnold et al. | |
| 2013/0026572 A1* | 1/2013 | Kawa et al. | 257/347 |

* cited by examiner

*Primary Examiner* — Wensing Kuo
*Assistant Examiner* — Shaka White
(74) *Attorney, Agent, or Firm* — Maxine L. Barasch; Keohane & D'Alessandro, PLLC

(57) ABSTRACT

Embodiments of the present invention provide a novel method and structure for forming finFET structures that comprise standard cells. An H-shaped cut mask is used to reduce the number of fins that need to be removed, hence increasing the fin efficiency.

10 Claims, 7 Drawing Sheets

FINFET DEVICE AND METHODS OF FABRICATION

FIELD OF THE INVENTION

The present invention relates generally to semiconductors and, more particularly, to an improved finFET device and method of fabrication.

BACKGROUND

In the fabrication of an Application-Specific Integrated Circuit (ASIC), a standard cell library is often used. A standard cell library may include several hundred predefined "cells", which are predefined circuit design components that can be selectively combined using a logic design entry software tool to implement a user's circuit design. Once the logic design is entered, placement and routing tools are utilized to generate a placement and routing solution, which arranges the various interrelated cells of the logic design such that it can be fabricated on a chip, and assigns predefined routing tracks that provide signal (interconnect) lines for passing signals between the interrelated cells. A layout tool is then utilized to construct a three-dimensional representation of the actual circuit structures (e.g., regions of doped semiconductor, insulated regions, and metal lines) needed to implement the logic design. Next, this three-dimensional representation is used to generate a set of masks that are used to fabricate an integrated circuit (IC), such as an ASIC.

As the trend towards miniaturization of integrated circuits (ICs) continues, there is a need for transistors to have increasingly smaller dimensions. Fin field effect transistor (FinFET) technology is becoming more prevalent as device size continues to shrink. It is therefore desirable to have improved finFET devices and methods of fabrication.

SUMMARY OF THE INVENTION

A first aspect of the present invention provides a method of forming a standard cell semiconductor structure, comprising: forming a plurality of semiconductor fins having a fin pitch; forming a drain contact strip; forming a source contact strip; performing a contact area cut process to form a gap in the drain contact strip and form a gap in the source contact strip, wherein each gap has a distance less than two times the fin pitch; and forming a gate contact within the gap of the source contact strip.

A second aspect of the present invention provides a standard cell semiconductor structure, comprising: a plurality of semiconductor fins having a fin pitch; a first drain contact strip; a second drain contact strip; a first source contact strip; a second source contact strip; a gate contact disposed between the first source contact strip and the second source contact strip, wherein a gap is disposed between the first source contact strip and the second source contact strip, and wherein the gap is less than two times the fin pitch.

A third aspect of the present invention provides a standard cell semiconductor structure, comprising: a plurality of semiconductor fins having a fin pitch; a first drain contact strip; a second drain contact strip; a first source contact strip; a second source contact strip; a gate contact disposed on a protrusion area between the first source contact strip and the second source contact strip, wherein the standard cell semiconductor structure comprises a fin efficiency in the range of 60 percent to 70 percent.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Exemplary embodiments will now be described more fully herein with reference to the accompanying drawings, in which exemplary embodiments are shown. Embodiments of the present invention provide a novel method and structure for forming finFET structures that comprise standard cells. An H-shaped cut mask is used to reduce the number of fins that need to be removed, hence increasing the fin efficiency and overall device performance.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1A:
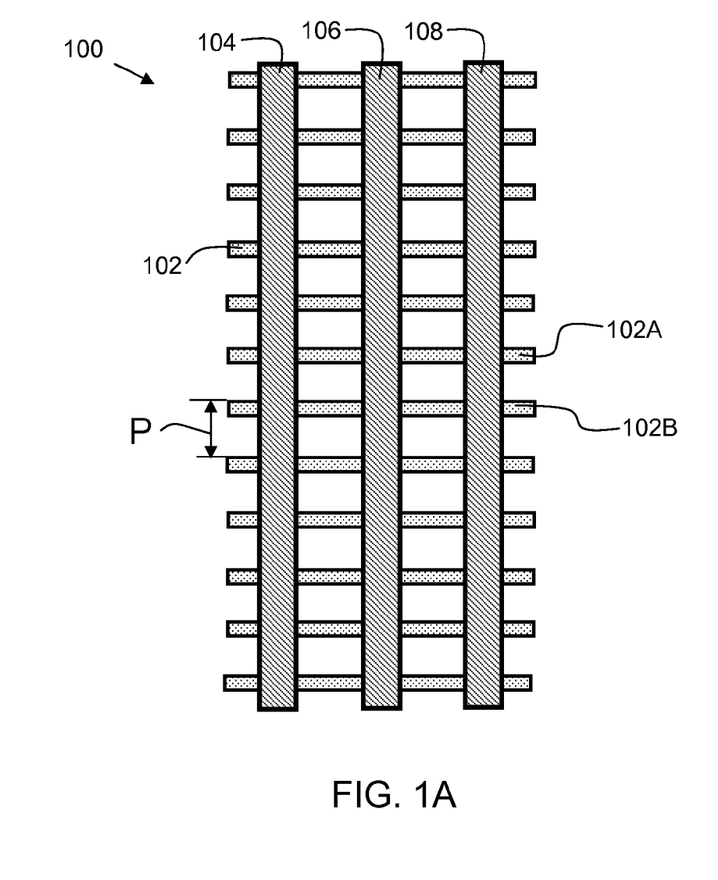
FIG. 1A shows a semiconductor structure including fins and contact strips, in accordance with illustrative embodiments.

FIG. 1A shows a semiconductor structure 100 which includes fins (indicated generally as 102) and contact strips 104, 106, and 108. The fins 102 may be formed of silicon, and may also include other materials, such as silicon germanium, oxide sub layers, nitride sub layers, and the like. The fins may be used to form one or more transistors (finFETs) to implement a logic element. The logic element may include, but is not limited to, a buffer, inverter, NAND gate, NOR gate, OR gate, XOR, gate, AND gate, and XNOR gate. The contact strips 104, 106, and 108 are comprised of a conductive material. In embodiments, the contact strips 104, 106, and 108 are comprised of tungsten. The contact strips 104, 106, and 108 may be used for source and drain (S/D) contacts for one or more transistors. In embodiments, contact strips 104 and 108 may be source contact strips, and contact strip 106 may be a drain contact strip. Within this disclosure, the contact strips may be referred to as "CA" regions. In some embodiments, circuit 100 may comprise a 9T standard cell, meaning that it includes a 9 track metal-2 (M2) layer. In other embodiments, circuit 100 may comprise an 8T standard cell, which includes an 8 track metal-2 layer. In the case of a 9T standard cell, the circuit 100 may comprise twelve fins 102. However, not all twelve fins are electrically active, due to the need to place other features, such as metal power rails, and gate contacts. The pitch P of the fins is defined as the distance between one side of a fin to the corresponding side of its neighboring fin. As the trend towards miniaturization continues, the pitch P is reducing, making it more challenging to preserve fins. However, it is desirable to keep as many electrically active fins as possible to improve fin efficiency, which allows for higher performance transistors. In embodiments of the present invention, fins 102A and 102B are not electrically active, whereas other fins adjacent to those fins remain electrically active.

Figure 1B:
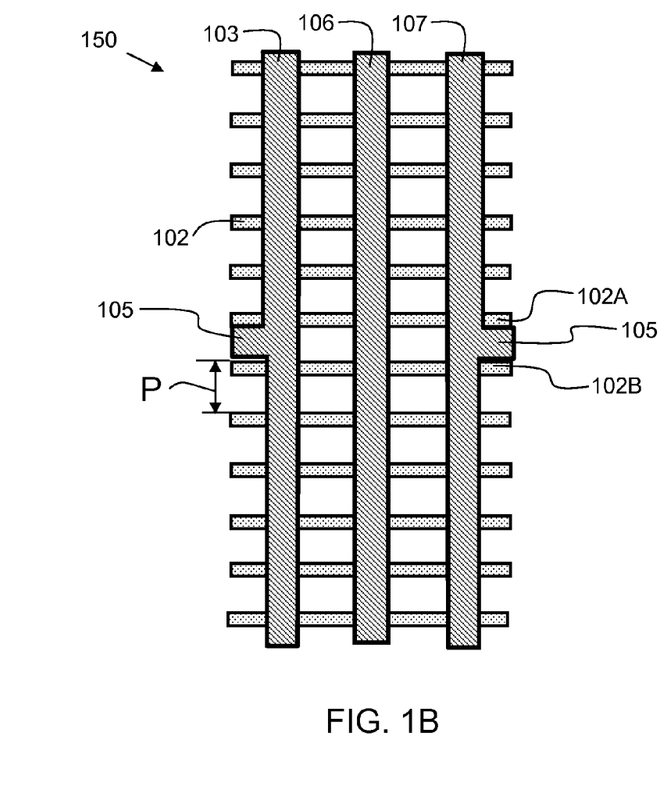
FIG. 1B shows a semiconductor structure including fins and contact strips, in accordance with alternative illustrative embodiments.

FIG. 1B shows a semiconductor structure 150 which includes fins (indicated generally as 102) and contact strips 103, 106, and 107. Semiconductor structure 150 is similar to semiconductor structure 100, except that contact strips 103 and 107 have a protrusion contact area 105 disposed near the center point of the respective contact strip, and protruding from the contact strip. The protrusion contact area 105 provides extra surface for forming contacts. The embodiment shown in FIG. 1B provides the advantage of an additional surface area for forming contacts.

Figure 2:
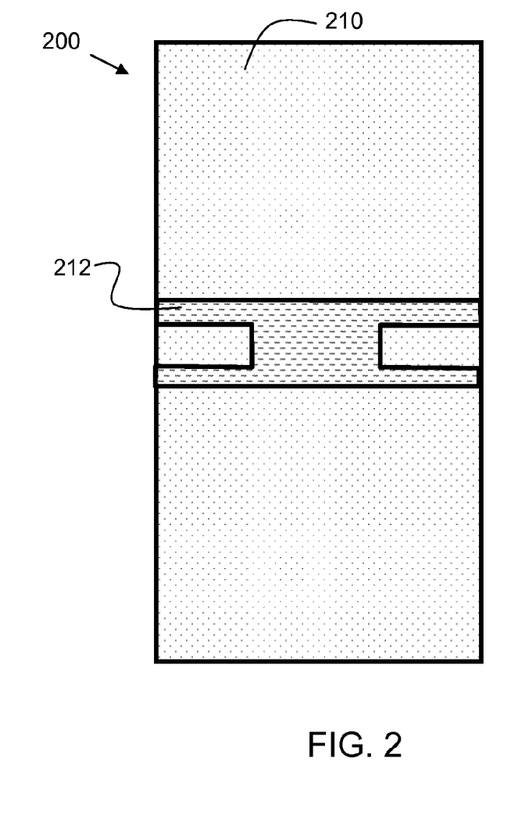
FIG. 2 shows a mask layer with an "H" mask pattern, in accordance with illustrative embodiments.

FIG. 2 shows a mask layer 200 with an "H" mask pattern 212, in accordance with illustrative embodiments. The mask layer 200 comprises masking material 210 which may include a photoresist or hard mask (such as an oxide region). The H mask pattern 212 (so named because it appears as a sideways "H") is formed by industry-standard lithographic and patterning techniques.

Figure 3:
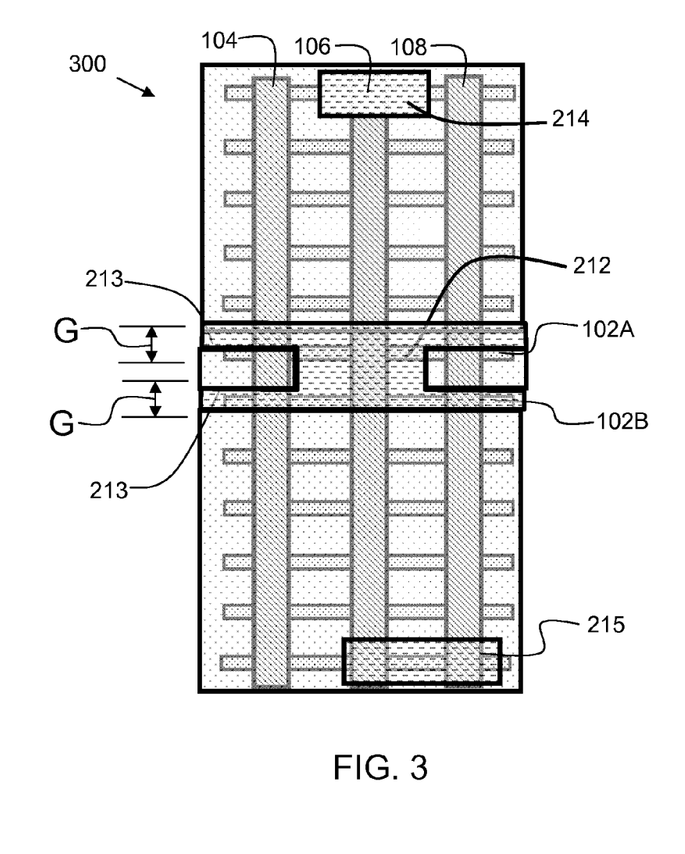
FIG. 3 shows the H mask pattern as superimposed on a semiconductor structure, in accordance with illustrative embodiments.

FIG. 3 shows a semiconductor structure 300 with the H mask pattern 212 as superimposed on the semiconductor structure 300. After a patterning process, the H mask pattern 212 is removed, exposing a portion of the contact strips which will be cut in a subsequent process step. Hence, the mask pattern 212 may be referred to as a "cut mask." H mask pattern 212 creates outer gap region 213 which comprises a gap length G. In some embodiments, gap length G may range from about 25 nanometers to about 30 nanometers. In other embodiments, gap length G may range from about 15 nanometers to about 25 nanometers. In addition to the H mask pattern 212, other regions (indicated as 214 and 215) may also be part of the cut mask, to remove various portions of the contact strips as per the intended circuit design. As part of the patterning process, portions of mask defined by cut mask patterns 212, 214, and 215 are removed, exposing the contact strips (indicated as 104, 106, and 108). An etch process may then be performed to remove portions of the contact strips that are underneath regions defined by mask patterns 212, 214, and 215. The etch process may be an anisotropic etch process. There are a variety of possible techniques for anisotropic etching of tungsten. In some embodiments, a plasma etcher using a gas mixture of $SF_6$ and $Cl_2$ may be used to perform the etching. In other embodiments, the semiconductor structure is etched under plasma bombardment conditions by using a feed gas mixture which includes a fluorine source (such as $SF_6$) plus a bromine source (such as HBr). A hydrocarbon source (e.g., an alkyl, such as methane) may also be included.

Figure 4:
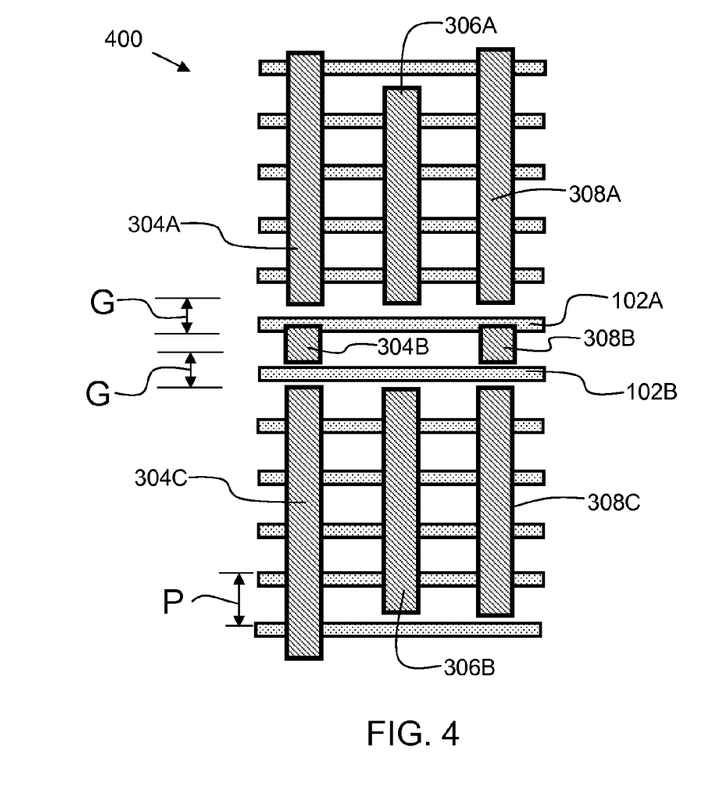
FIG. 4 shows a semiconductor structure with cut contact strips, in accordance with illustrative embodiments.

FIG. 4 shows a semiconductor structure 400 with cut contact strips, in accordance with illustrative embodiments. Contact strip 104 (see FIG. 1) is now cut into smaller contact strips, indicated as 304A, 304B, and 304C. Similarly, contact strip 108 (see FIG. 1) is now cut into smaller contact strips, indicated as 308A, 308B, and 308C. The middle contact strip 106 (see FIG. 1) is cut into smaller contact strips, indicated as 306A and 306B. The distance G between contact strip 304A and contact strip 304B is less than two times the fin pitch P. Hence, only two fins are "sacrificed" from being electrically connected to a contact strip, whereas prior art structures sacrificed more fins, and hence have a reduced fin efficiency value.

Figure 5:
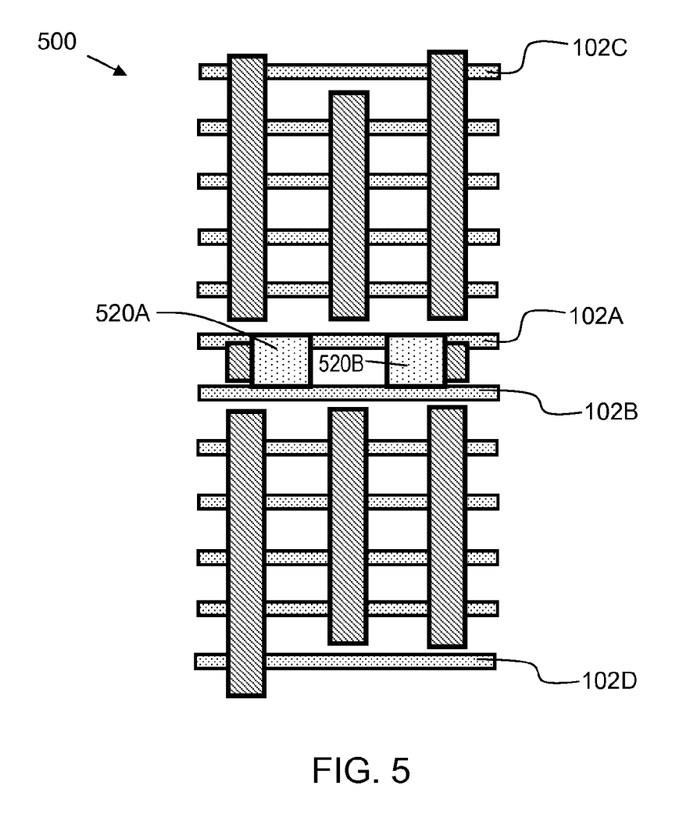
FIG. 5 shows a semiconductor structure including gate contacts, in accordance with illustrative embodiments.

FIG. 5 shows a semiconductor structure 500 including gate contacts 520A and 520B, in accordance with illustrative embodiments. The gate contacts 520A and 520B are deposited in an area previously occupied by the removed portion of the contact strips. The removed portions of contact strips are defined by the H mask pattern 212. The gate contacts 520A and 520B may be referred to as CB contact regions. In embodiments, the gate contacts 520A and 520B may be comprised of a metal, such as tungsten. The fins 102C and 102D are underneath the location of M1 power rails, and hence are not electrically active. Similarly the fins 102A and 102B are not electrically active. These non-active fins 102A, 102Bm 102C, and 102D are to be removed with a fin cut mask etch process.

Figure 6A:
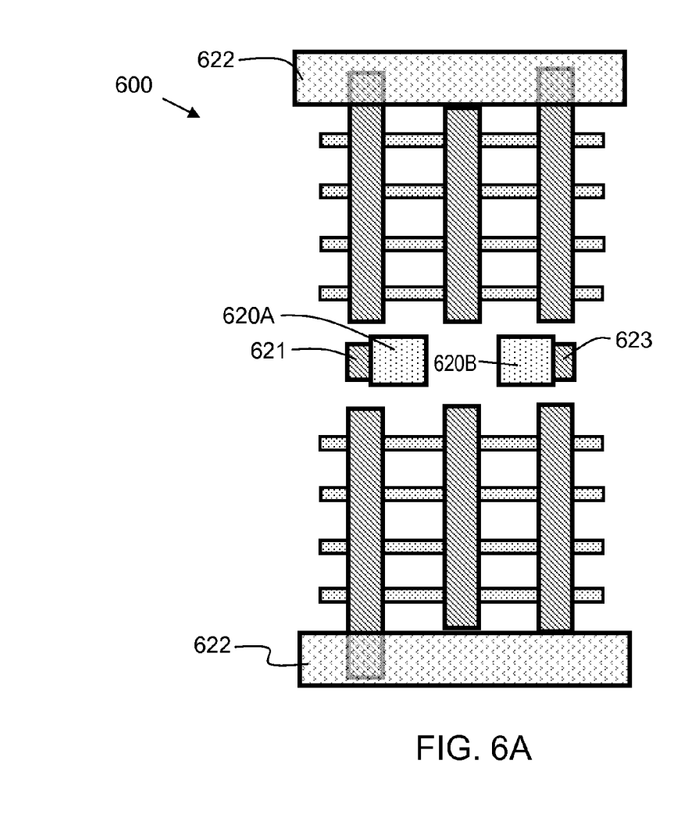
FIG. 6A shows a semiconductor structure including metal-1 power rails, in accordance with illustrative embodiments.

FIG. 6A shows a semiconductor structure 600 including metal-1 power rails 622, in accordance with illustrative embodiments. The gate contact 620A is formed on contact area 621. The gate contact 620B is formed on contact area 623. As shown in FIG. 6A, the four non-active fins (102A, 102B, 102C, and 102D of FIG. 5) are removed. Hence, out of a total of twelve fins, four are not electrically active and are thus removed, while the remaining eight are electrically active, resulting in a fin efficiency rating of 8/12=66.67%. This is improved over prior art structures that may have a fin efficiency rating of 59% or less. Embodiments of the present invention provide a standard cell semiconductor structure having a fin efficiency in the range of 60 percent to 70 percent.

Figure 6B:
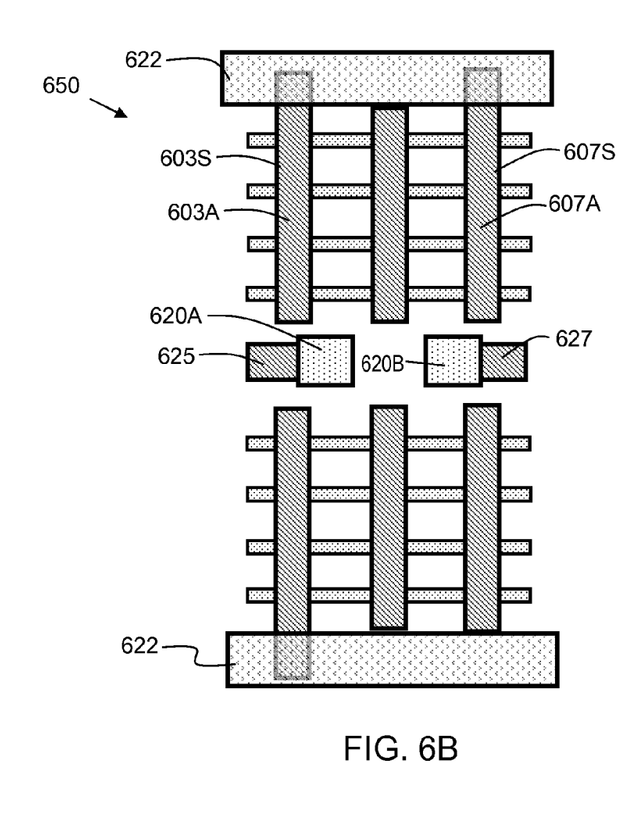
FIG. 6B shows a semiconductor structure including metal-1 power rails, in accordance with alternative illustrative embodiments.

FIG. 6B shows a semiconductor structure 650 including metal-1 power rails 622, in accordance with alternative illustrative embodiments. The gate contact 620A is formed on contact area 625, which is a protrusion area, extending beyond the side 603S of contact strip 603A. Similarly, gate contact 620B is formed on contact area 627, which is a protrusion area, extending beyond the side 607S of contact strip 607A. Hence, semiconductor structure 650 started from a structure such as 150 shown in FIG. 1B, where the outer contact strips comprise protrusion contact areas.

Figure 7:
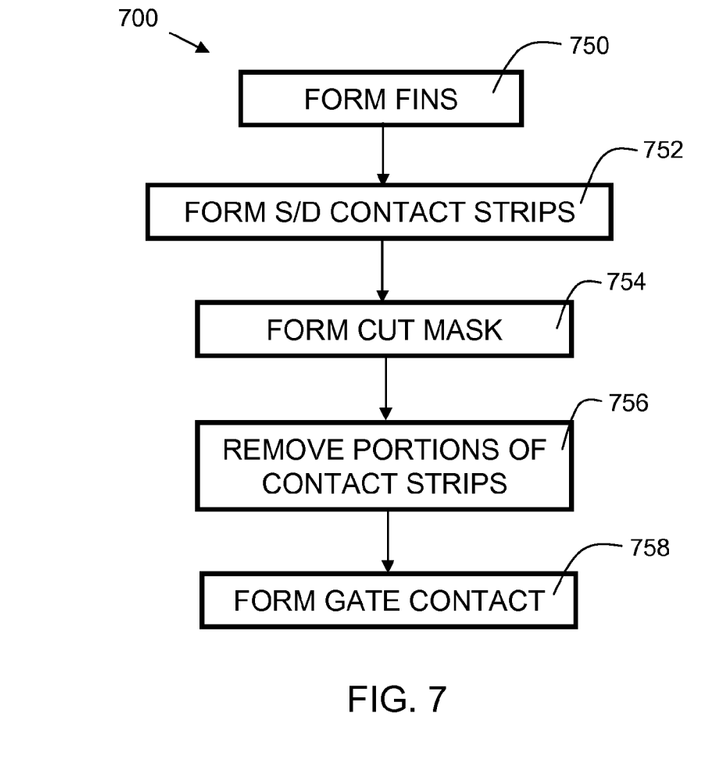
FIG. 7 is a flowchart indicating process steps for illustrative embodiments.

FIG. 7 is a flowchart 700 indicating process steps for illustrative embodiments. In process step 750, fins are formed. In some cases, each standard cell may have twelve fins. In other cases, a different number of fins may be used. The fins may be formed via industry-standard patterning methods, such as sidewall image transfer (SIT), and the like. In process step 752, source and drain contact strips are formed. These contact strips may be referred to as CA contacts. In process step 754, the cut mask is formed, including H mask region (see 212 of FIG. 2). In process step 756, portions of the contact strips, as defined by the cut mask, are removed. This may be performed via an anisotropic etch process. In process step 758, gate contacts are formed. From this point forward, a standard fabrication process may be used to complete the integrated circuit.

What is claimed is:

1. A method of forming a standard cell semiconductor structure, comprising:

forming a plurality of semiconductor fins having a fin pitch;

forming a drain contact strip;

forming a source contact strip;

performing a contact area cut process to form a gap in the drain contact strip and form a gap in the source contact strip, wherein each gap has a distance less than two times the fin pitch; and forming a gate contact within the gap of the source contact strip.

2. The method of claim 1, wherein forming a drain contact strip comprises depositing tungsten.

3. The method of claim 1, wherein performing a contact area cut process comprises:

forming a cut mask; and performing an etch process on the drain contact strip and the source contact strip.

4. The method of claim 1, wherein performing an etch process comprises performing an anisotropic etch process.

5. The method of claim 4, wherein performing an etch process comprises performing an etch with a plasma etcher using a gas mixture comprising SF6 and Cl2.

6. The method of claim 4, wherein performing an etch process comprises performing an etch with a plasma etcher using a gas mixture comprising SF6 and HBr.

7. The method of claim 3, wherein forming a cut mask comprises forming a cut mask comprising an H shape.

8. The method of claim 7, wherein forming a cut mask comprising an H shape comprises forming a cut mask having an outer gap ranging from about 25 nanometers to about 30 nanometers.

9. The method of claim 7, wherein forming a cut mask comprising an H shape comprises forming a cut mask having an outer gap ranging from about 15 nanometers to about 25 nanometers.

10. The method of claim 2, wherein forming a gate contact comprises forming a tungsten contact.

* * * * *